United States Patent
Son et al.

(10) Patent No.: US 9,519,182 B2
(45) Date of Patent: Dec. 13, 2016

(54) DISPLAY PANEL AND METHOD OF MANUFACTURING THE SAME

(71) Applicant: Samsung Display Co., Ltd., Yongin, Gyeonggi-Do (KR)

(72) Inventors: Jung-Ha Son, Seoul (KR); Joo-Hyung Lee, Seongnam-si (KR); Yun-Jong Yeo, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/644,757

(22) Filed: Mar. 11, 2015

(65) Prior Publication Data

US 2016/0116795 A1 Apr. 28, 2016

(30) Foreign Application Priority Data

Oct. 27, 2014 (KR) .......................... 10-2014-0146351

(51) Int. Cl.
*G02F 1/1335* (2006.01)
*G02F 1/1343* (2006.01)
(Continued)

(52) U.S. Cl.
CPC ....... *G02F 1/133514* (2013.01); *G02F 1/1341* (2013.01); *G02F 1/1368* (2013.01);
(Continued)

(58) Field of Classification Search
CPC ............ G02F 1/133514; G02F 1/13439; G02F 1/1341; G02F 1/136209; G02F 1/136286; G02F 1/134309; G02F 1/1368; H01L 27/124; H01L 27/1259
See application file for complete search history.

(56) References Cited

U.S. PATENT DOCUMENTS

2004/0245917 A1* 12/2004 Lu ...................... H01L 51/5203
313/503
2008/0204613 A1* 8/2008 Kim .................. G02F 1/133707
349/33
(Continued)

FOREIGN PATENT DOCUMENTS

KR 1020110047001 A 5/2011
KR 1020110069730 A 6/2011
(Continued)

OTHER PUBLICATIONS

European Search Report corresponding to EP Application No. 15176564.1, dated Dec. 14, 2015, 16 pages.

*Primary Examiner* — Donald Raleigh
(74) *Attorney, Agent, or Firm* — Innovation Counsel LLP

(57) ABSTRACT

A display panel includes a first substrate comprising a plurality of pixel areas, a second substrate facing the first substrate, a liquid crystal layer interposed between the first substrate and the second substrate, a thin film transistor comprising a gate electrode disposed on the first substrate, a semiconductor pattern overlapping with the gate electrode, a source electrode and a drain electrode overlapping with the semiconductor pattern and spaced apart from each other, a plasmonic color filter to which a common voltage is configured to be applied, and comprising a same material as the gate electrode, disposed on a same layer as the gate electrode, and comprising a plurality of holes through which light is configured to be transmitted and a pixel electrode to which a gray scale voltage is configured to be applied, and overlapping with the plasmonic color filter, and electrically connected to the drain electrode.

20 Claims, 7 Drawing Sheets

(51) Int. Cl.
*G02F 1/1368* (2006.01)
*G02F 1/1362* (2006.01)
*G02F 1/1341* (2006.01)
*H01L 27/12* (2006.01)

(52) U.S. Cl.
CPC .... *G02F 1/13439* (2013.01); *G02F 1/134309* (2013.01); *G02F 1/136209* (2013.01); *G02F 1/136286* (2013.01); *H01L 27/124* (2013.01); *H01L 27/1259* (2013.01); *G02F 2001/134372* (2013.01); *G02F 2001/136222* (2013.01); *G02F 2203/10* (2013.01)

(56) References Cited

U.S. PATENT DOCUMENTS

| | | | | |
|---|---|---|---|---|
| 2009/0102773 | A1* | 4/2009 | Um | G02F 1/136213 345/92 |
| 2011/0102714 | A1* | 5/2011 | Lee | G02F 1/133514 349/105 |
| 2011/0269364 | A1* | 11/2011 | Yoon | G02B 5/201 445/24 |
| 2011/0285942 | A1* | 11/2011 | Guo | G02B 5/008 349/96 |
| 2013/0107153 | A1* | 5/2013 | Qin | G02F 1/1368 349/43 |

FOREIGN PATENT DOCUMENTS

| | | |
|---|---|---|
| KR | 1020110070574 A | 6/2011 |
| KR | 1020130011914 A | 1/2013 |

\* cited by examiner

DISPLAY PANEL AND METHOD OF MANUFACTURING THE SAME

CROSS-REFERENCE TO RELATED APPLICATIONS

This application claims priority under 35 U.S.C. §119 to Korean Patent Application No. 10-2014-0146351, filed on Oct. 27, 2014 in the Korean Intellectual Property Office KIPO, the contents of which are herein incorporated by reference in their entireties.

BACKGROUND

1. Field

Exemplary embodiments of the present inventive concept relate to a display panel and method of manufacturing the display panel.

2. Description of the Related Art

A liquid crystal display apparatus is one of a flat panel display FPD, which is used broadly recently. Examples of the flat panel display include, but are not limited to, a liquid crystal display ("LCD"), a plasma display panel ("PDP") and an organic light emitting display ("OLED").

The liquid crystal display apparatus applies voltages to molecules of liquid crystal to adjust arrangements of the molecules thereby changing optical characteristics of a liquid crystal cell such as birefringence, optical activity, dichroism and light scattering to display an image.

The liquid crystal display apparatus includes an array substrate having a pixel electrode, a color filter substrate having a common electrode and a liquid crystal layer interposed between the array substrate and the color filter substrate. The liquid crystal display apparatus displays an image by adjusting transmissivity for each pixel.

Recently, in order to improve a low side-visibility, a patterned vertical alignment ("PVA") mode and an in-plane switching ("IPS") mode have been developed. However, the PVA mode has disadvantages, such as an afterimage and a poor side viewing angle. The IPS mode also has disadvantages, such as low luminance. Accordingly, in order to improve the above disadvantages, a plane to line switching ("PLS") mode having a high side-visibility and high luminance has been developed.

A display apparatus using the PLS mode includes a gate electrode, a source electrode, a drain electrode, pixel electrode and common electrode overlapping with the pixel electrode. The gate electrode is formed of a material having a low resist value, i.e., having a low resistance. The common electrode is formed of a material having a high transmissivity. Accordingly, it is difficult to form the gate electrode and the common electrode by the same material.

In addition, the color filter substrate includes a color filter. Light transmits through the array substrate, the liquid crystal layer and the color filter substrate. A transmissivity of the light is less than 5%. When the light transmits through the color filter, the transmissivity of the light may be decreased by 15%. Accordingly, in order to improve the transmissivity, a plasmonic color filter has been developed. However, the plasmonic color filter requires an additional manufacturing process, so that a manufacturing cost may be increased.

SUMMARY

Exemplary embodiments of the present inventive concept provide a display panel capable of increasing transmissivity.

Exemplary embodiments of the present inventive concept further provide a method of manufacturing the display panel.

In an exemplary embodiment of a display panel according to the present inventive concept, the display panel includes a first substrate comprising a plurality of pixel areas, a second substrate facing the first substrate, a liquid crystal layer interposed between the first substrate and the second substrate, a thin film transistor comprising a gate electrode disposed on the first substrate, a semiconductor pattern overlapping with the gate electrode, a source electrode and a drain electrode overlapping with the semiconductor pattern and spaced apart from each other, a plasmonic color filter to which a common voltage is configured to be applied, and comprising a same material as the gate electrode, disposed on a same layer as the gate electrode, and comprising a plurality of holes through which light is configured to be transmitted and a pixel electrode to which a gray scale voltage is configured to be applied, and overlapping with the plasmonic color filter, and electrically connected to the drain electrode.

In an exemplary embodiment, the gate electrode and the plasmonic color filter may include at least one of a material selected from the group consisting of copper (Cu), aluminum (Al), molybdenum (Mo), titanium (Ti) and compositions thereof.

In an exemplary embodiment, the display panel may further include a plurality of gate lines disposed on the first substrate and extending in a first direction and a plurality of data lines disposed on the first substrate and extending in a second direction crossing the first direction. The pixel areas may be defined by the gate lines and the data lines, and plasmonic color filters including the plasmonic color filter may be disposed on the pixel areas.

In an exemplary embodiment, lights configured to be transmitted through adjacent plasmonic color filters may have a different wavelength.

In an exemplary embodiment, the plasmonic color filters may include a red plasmonic color filter, a green plasmonic color filter and a blue plasmonic color filter.

In an exemplary embodiment, the holes of the red plasmonic color filter may have a diameter of more than 220 nm and less than 230 nm. The holes may be spaced apart from each other by more than 500 nm and less than 600 nm.

In an exemplary embodiment, the holes of the green plasmonic color filter may have a diameter of more than 175 nm and less than 185 nm. The holes may be spaced apart from each other by more than 400 nm and less than 500 nm.

In an exemplary embodiment, the holes of the blue plasmonic color filter may have a diameter of more than 150 nm and less than 160 nm. The holes may be spaced apart from each other by more than 250 nm and less than 350 nm.

In an exemplary embodiment, the display panel may further include a first lithium fluoride (LiF) layer disposed on a lower surface of the plasmonic color filter and a second LiF layer disposed on an upper surface of the plasmonic color filter.

In an exemplary embodiment, a thickness of the first LiF layer and the second LiF layer may be less than 1 nm.

In an exemplary embodiment, the pixel electrode may have a slit pattern.

In an exemplary embodiment, the display panel may further include a gate insulation layer insulating the gate electrode and the plasmonic color filter and a passivation layer covering the source electrode and the drain electrode. The pixel electrode may be disposed on the passivation layer.

In an exemplary embodiment, the display panel may further include a black matrix disposed on the second substrate and overlapping with the thin film transistor.

In an exemplary embodiment of a method of manufacturing a display substrate according to the present inventive concept, the method includes forming a metal layer on a first substrate, forming a photoresist layer on the metal layer, developing the photoresist layer to form a photo pattern, etching the metal layer by using the photo pattern as a mask to form a gate electrode and a plasmonic color filter comprising a plurality of holes through which light is configured to be transmitted, forming a source electrode and a drain electrode on the gate electrode and the plasmonic color filter and forming a pixel electrode electrically connected to the drain electrode, and overlapping with the plasmonic color filter.

In an exemplary embodiment, the gate electrode and the plasmonic color filter may include at least one of a material selected from the group consisting of copper (Cu), aluminum (Al), molybdenum (Mo), titanium (Ti) and compositions thereof.

In an exemplary embodiment, a plurality of gate lines may be disposed on the first substrate and extend in a first direction. A plurality of data lines may be disposed on the first substrate and extend in a second direction crossing the first direction. The pixel areas may be defined by the gate lines and the data lines. Plasmonic color filters including the plasmonic color filter may be disposed on the pixel areas.

In an exemplary embodiment, the method may further include forming a first lithium fluoride (LiF) layer on the first substrate before forming the metal layer and forming a second LiF layer on an upper surface of the plasmonic color filter.

In an exemplary embodiment, a thickness of the first LiF layer and the second LiF layer may be less than 1 nm.

In an exemplary embodiment, the method may further include forming a gate insulation layer covering the gate electrode and the plasmonic color filter and forming a passivation layer covering the source electrode and the drain electrode. The pixel electrode may be disposed on the passivation layer.

In an exemplary embodiment, the method may further include forming a black matrix overlapping with a thin film transistor on a second substrate, providing the second substrate to face the first substrate and injecting liquid crystal molecules to a space between the first substrate and the second substrate to form a liquid crystal layer.

According to the present exemplary embodiment, the plasmonic color filter may be formed of the same material as the gate pattern. Thus, a manufacturing process may be simplified. In addition, since the plasmonic color filter is formed, a manufacturing process for forming a color filter may be omitted. Thus, a manufacturing cost may be decreased.

BRIEF DESCRIPTION OF THE DRAWINGS

The above and other features and advantages of the present inventive concept will become more apparent by describing in detailed exemplary embodiments thereof with reference to the accompanying drawings, in which.

DETAILED DESCRIPTION OF THE INVENTIVE CONCEPT

Hereinafter, embodiments will be explained in detail with reference to the accompanying drawings.

Figure 1:
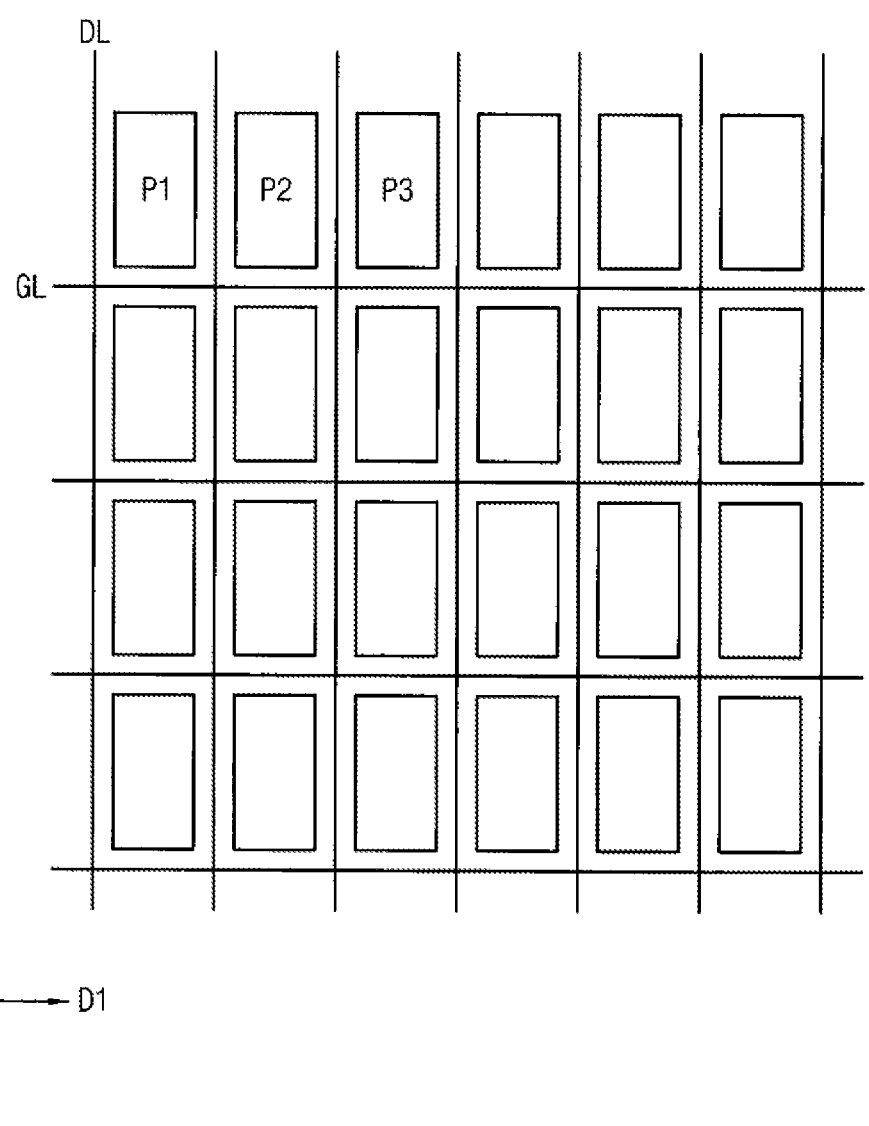
FIG. 1 is a plan view illustrating a display panel according to an exemplary embodiment of the present inventive concept.
Figure 2:
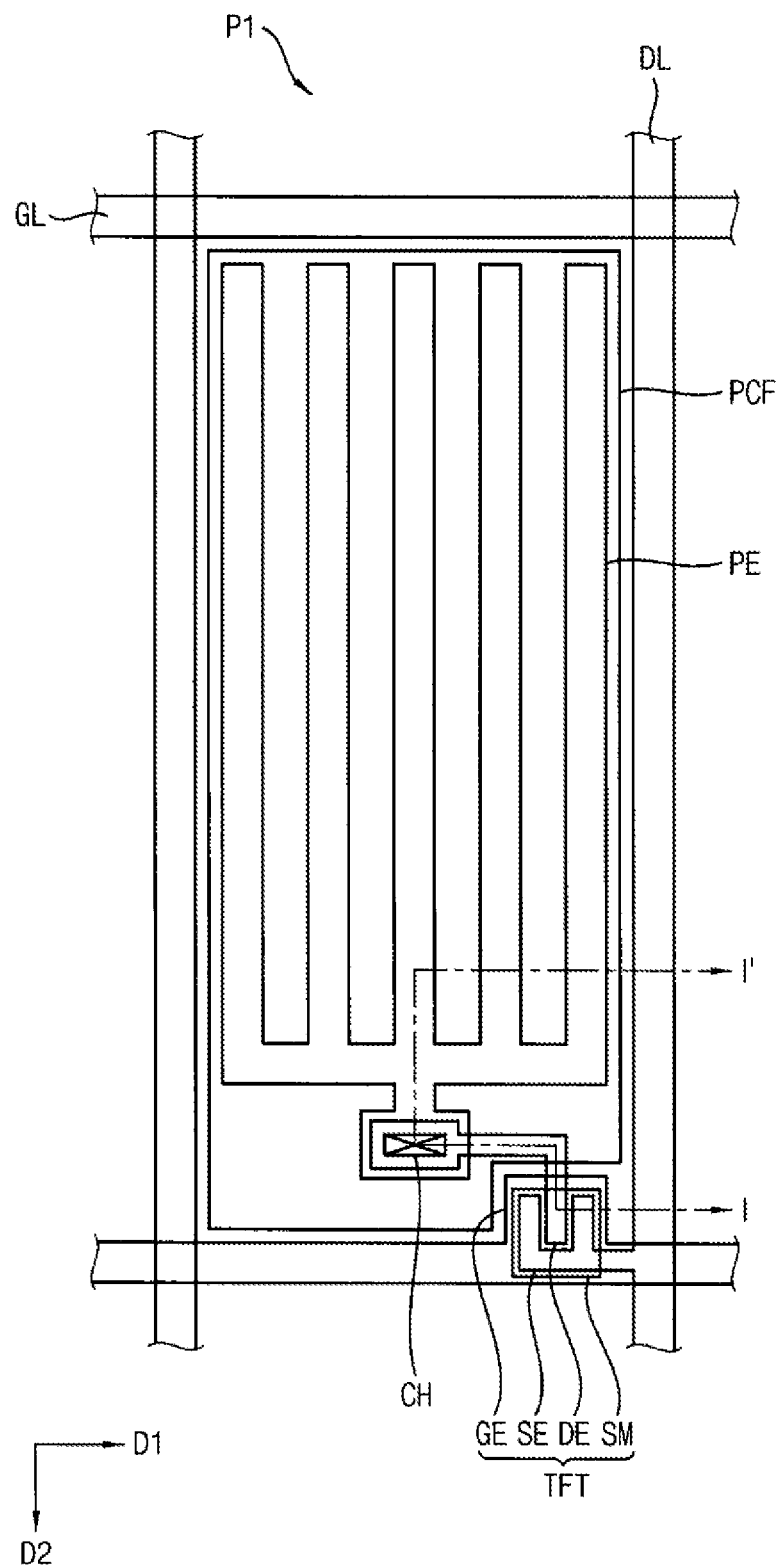
FIG. 2 is a plan view illustrating a first pixel of FIG. 1.
Figure 3:
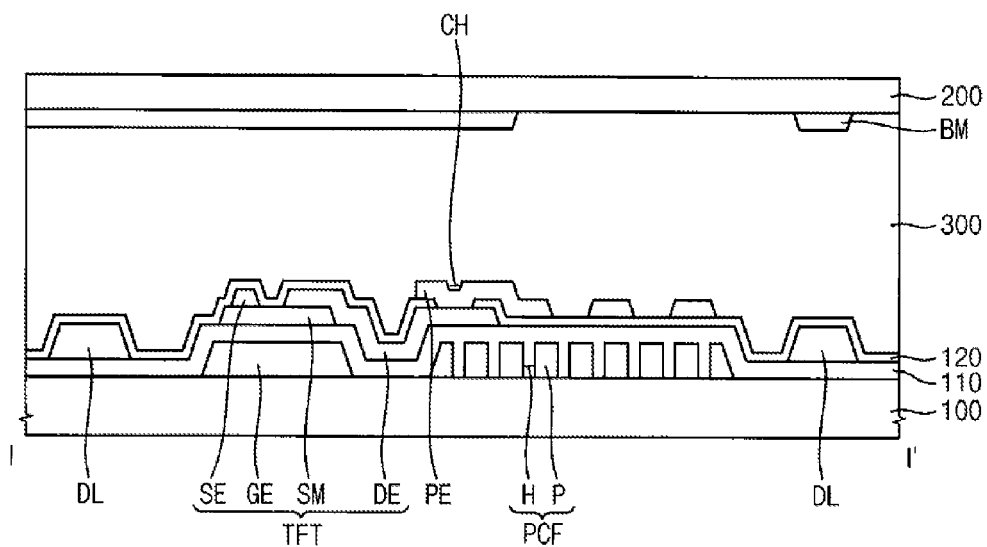
FIG. 3 is a cross-sectional view taken along a line I-I' of FIG. 2.
Figure 4:
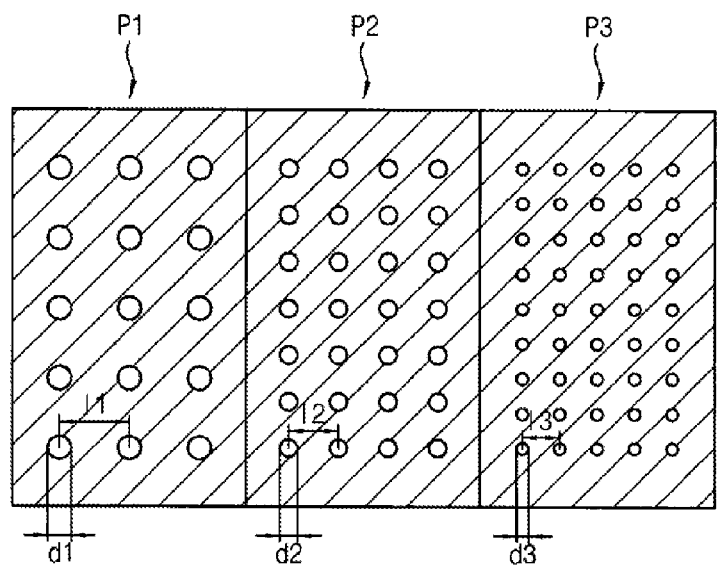
FIG. 4 is a plan view illustrating plasmonic color filters of first to third pixels of FIG. 1.
Figure 5:
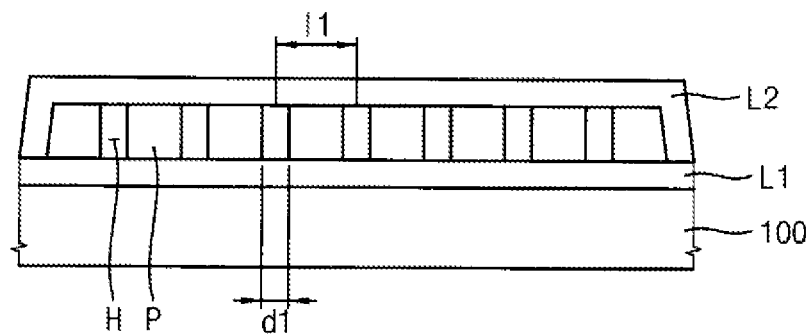
FIG. 5 is a cross-sectional view illustrating a plasmonic color filter according to an exemplary embodiment of the present inventive concept.

FIG. 1 is a plan view illustrating a display panel according to an exemplary embodiment of the present inventive concept. FIG. 2 is a plan view illustrating a first pixel of FIG. 1. FIG. 3 is a cross-sectional view taken along a line I-I' of FIG. 2. FIG. 4 is a plan view illustrating plasmonic color filters of first to third pixels of FIG. 1. FIG. 5 is a cross-sectional view illustrating a plasmonic color filter according to an exemplary embodiment of the present inventive concept.

Referring to FIG. 1, a display panel according to an exemplary embodiment of the present inventive concept panel includes a plurality of gate lines GL, a plurality of data lines DL and a plurality of pixels.

The gate lines GL may extend in a first direction D1. The data lines DL may extend in a second direction D2 substantially perpendicular to the first direction D1. Alternatively, the gate lines GL may extend in the second direction D2 and the data lines DL may extend in the first direction D1.

The pixels may be arranged in a matrix shape. The pixels may be disposed in areas defined by the gate lines GL and the data lines DL.

Each pixel may be connected to a corresponding gate line GL and a corresponding data line DL adjacent to the pixel.

Each pixel may have a rectangle shape extending in the second direction D2, a V-shape, a Z-shape or the like.

Referring to FIGS. 2 to 5, the display panel includes a first substrate 100, a second substrate 200 and a liquid crystal layer 300.

The first substrate 100 includes a thin film transistor TFT, a plasmonic color filter PCF, a gate insulating layer 110, a data line DL, a passivation layer 120 and a pixel electrode PE.

The first base substrate 100 may be a transparent insulating substrate. Examples of the transparent insulating substrate may be, but are not limited to, a glass substrate, a plastic substrate or the like. The first base substrate 100 may include a plurality of pixel areas for displaying an image. The plurality of the pixel areas may be disposed in a matrix shape having a plurality of rows and a plurality of columns. The pixel areas may be defined by the gate lines GL and the data lines DL.

Each pixel may further include a switching element. For example, the switching element may be the thin film transistor TFT. The switching element may be connected to the gate line GL and the data line DL adjacent to the switching element. The switching element may be disposed at a crossing area of the gate line GL and the data line DL. That is, the thin film transistor TFT may be disposed on the first substrate 100.

A gate pattern may include a gate electrode GE and the gate line GL. The gate pattern may be disposed on the first base substrate 100. The gate line GL is electrically connected to the gate electrode GE.

The gate insulating layer 110 may cover the gate pattern, which is formed on the first base substrate 100, and may insulate the gate pattern. The gate insulating layer 110 may include an inorganic insulating material. For example, the gate insulating layer 110 may include silicon oxide ($SiO_x$) or silicon nitride ($SiN_x$).

A semiconductor pattern SM may be disposed on the gate insulating layer 110. The semiconductor pattern SM may overlap with the gate electrode GE.

A data pattern may include the data line DL, a source electrode SE and a drain electrode DE. The data pattern may be disposed on the semiconductor pattern SM, which is formed on the gate insulating layer 110. The source electrode SE may overlap the semiconductor pattern SM. The source electrode SE may be electrically connected to the data line DL.

The drain electrode DE may be spaced apart from the source electrode SE with respect to the semiconductor pattern SM. The semiconductor pattern SM may have a conductive channel between the source electrode SE and the drain electrode DE.

The thin film transistor TFT may include the gate electrode GE, the source electrode SE, the drain electrode DE and the semiconductor pattern SM.

A plurality of plasmonic color filters PCF is disposed on the first substrate 100.

Adjacent plasmonic color filters PCF are disposed between adjacent data lines DL.

The plasmonic color filter PCF provides light transmitting through the liquid crystal layer 300 with a color.

The plasmonic color filter PCF may include the same material as the gate electrode GE. For example, the plasmonic color filter PCF may include copper (Cu), aluminum (Al), molybdenum (Mo), titanium (Ti) or compositions thereof.

The plasmonic color filter PCF may be formed by the same process as the gate electrode GE. Thus, a manufacturing process may be simplified. In addition, since the plasmonic color filter PCF is formed, a manufacturing process for forming a color filter may be omitted. Thus, a manufacturing cost may be decreased.

For example, the plasmonic color filter PCF may be disposed on the same layer as the gate electrode GE. A common voltage is applied to the plasmonic color filter PCF. Thus, the plasmonic color filter PCF may be performed, i.e., may perform, as a common electrode.

Therefore, the plasmonic color filter PCF is used as a common electrode. A manufacturing process for forming a common electrode may be omitted. Thus, a manufacturing cost may be decreased.

The plasmonic color filters PCF are disposed on the pixel areas. Colors of adjacent plasmonic color filters PCF may be different. Thus, lights transmitting through adjacent plasmonic color filters PCF may have a different wavelength.

For example, the plasmonic color filters PCF may include red plasmonic color filters PCF (red PCF), green plasmonic color filters PCF (green PCF) and blue plasmonic color filters PCF (blue PCF).

The plasmonic color filters PCF may include a plurality of holes H through which light is transmitted and a plurality of metal patterns P. A diameter of the holes H and an interval of the holes H may be adjustable. Thus, lights transmitting through adjacent plasmonic color filters PCF may have a different wavelength.

Concretely, when a plasmonic color filters PCF including holes and metal patterns having a certain diameter and a certain interval is formed, an electric field of incident light is coupled with a Plasmon. Thus, only light having a certain wavelength may be transmitted, and lights having a different wavelength are reflected. For example, a red color light, a green color light or a blue color light may be transmitted selectively.

When light is incident to the plasmonic color filters PCF including the plurality of holes H through which light is transmitted and the plurality of metal patterns P, a light having a certain wavelength is caused resonance, i.e., is caused to resonate, with free electrons of the surface. Thus, a light having a certain wavelength is formed. That phenomenon is a surface plasmon resonance. Therefore, only a light having a certain wavelength capable of forming the surface plasmon resonance may be transmitted through the holes H. Lights having a different wavelength are reflected.

For example, the holes H may have a circular shape, a rectangular shape, a triangular shape or the like.

For example, a first pixel P1 may include a red plasmonic color filter PCF. A second pixel P2 may include a green plasmonic color filter PCF. A third pixel P3 may include a blue plasmonic color filter PCF. The first pixel P1 may be disposed adjacent to the second pixel P2. The second pixel P2 may be disposed adjacent to the third pixel P3.

The holes of the red plasmonic color filter PCF may have a first diameter d1 of more than 220 nm and less than 230 nm and may be spaced apart from each other by a first distance l1 of more than 500 nm and less than 600 nm. For example, a red light has a wavelength of 627 nm. Thus, the red plasmonic color filter PCF may display a red color.

The holes of the green plasmonic color filter PCF may have a second diameter d2 of more than 175 nm and less than 185 nm and may be spaced apart from each other by a second distance l2 more than 400 nm and less than 500 nm. For example, a green light has a wavelength of 538 nm. Thus, the green plasmonic color filter PCF may display a green color.

The holes of the blue plasmonic color filter PCF may have a third diameter d3 of more than 150 nm and less than 160 nm and may be spaced apart from each other by a third distance l3 more than 250 nm and less than 350 nm. For example, a blue light has a wavelength of 436 nm. Thus, the blue plasmonic color filter PCF may display a blue color.

In order to improve optical characteristic of the plasmonic color filter PCF, lithium fluoride (LiF) layers L1, L2 may be disposed on a lower surface and on an upper surface of the plasmonic color filter PCF as shown in FIG. 5. The first LiF layer L1 may be disposed on a lower surface of the plasmonic color filter PCF. The second LiF layer L2 may be disposed on an upper surface of the plasmonic color filter PCF.

For example, thickness of the first LiF layer L1 and the second LiF layer L2 may be less than 1 nm.

The gate insulating layer 110 may be disposed on a gate pattern and the plasmonic color filter PCF.

The gate insulating layer 110 may cover the gate pattern, which is formed on the first base substrate 100, and may insulate the gate pattern. The gate insulating layer 110 may include an inorganic insulating material. For example, the gate insulating layer 110 may include silicon oxide ($SiO_x$) or silicon nitride ($SiN_x$).

The passivation layer 120 is disposed on the gate insulating layer 110 on which the data line DL is formed. The passivation layer 120 covers the data line DL. The passivation layer 120 may be disposed on the first substrate 100 entirely.

The passivation layer 120 may include an inorganic insulating material. For example, the passivation layer 120 may include silicon oxide ($SiO_x$) or silicon nitride ($SiN_x$).

The pixel electrode PE is disposed on the passivation layer 120.

The pixel electrode PE is electrically connected to the drain electrode DE of the thin film transistor TFT through a contact hole CH. A gray scale voltage is applied to the pixel electrode PE through the drain electrode DE of the thin film transistor TFT.

The pixel electrode PE may be disposed in a pixel area. The pixel electrode PE may be disposed between adjacent data lines DL.

For example, the pixel electrode PE may include a transparent conductive material, such as indium tin oxide (ITO) and indium zinc oxide (IZO). In addition, the pixel electrode PE may include titanium (Ti) and/or molybdenum titanium (MoTi).

The pixel electrode PE may have a slit pattern.

The pixel electrode PE overlaps with the plasmonic color filter PCF. Thus, a fringe field may be formed by the pixel electrode PE to which gray scale voltage is applied and the plasmonic color filter PCF to which a common voltage is applied. Therefore, a display panel according to the present inventive concept may be operated as a PLS mode.

The second base substrate 200 may be a transparent insulating substrate. Examples of the transparent insulating substrate may be, but are not limited to, a glass substrate, a plastic substrate or the like.

A black matrix BM may be disposed on the second base substrate 200. The black matrix BM may block a light.

The black matrix BM may be disposed on a non-display area of the display panel to block a light from the outside.

The black matrix BM may overlap with the gate line GL, the data line DL and the thin film transistor TFT.

The black matrix BM may include a metal material having a low transmissivity or a black material including a photosensitive organic material.

For example, the metal material may include molybdenum, titanium, tungsten or compositions thereof.

For example, the black material may include a pigment such as a carbon black or the like.

The liquid crystal layer 300 may be disposed between the first substrate 100 and the second substrate 200.

For example, the liquid crystal layer 300 may include liquid crystal molecules. An alignment of the liquid crystal molecules in the liquid crystal layer 300 may be controlled by an electric field applied between the pixel electrode PE and the common electrode CE. Therefore, a light transmittance of the pixel may be controlled.

Although did not shown, the display panel further include an alignment layer orienting the liquid crystal molecules of the liquid crystal layer 300.

The liquid crystal molecules of the liquid crystal layer 300 may be pre-tilted by the alignment layer.

FIGS. 6A to 6F are cross-sectional views illustrating a method of manufacturing the display substrate according to an exemplary embodiment of the present inventive concept.

Figure 6A:
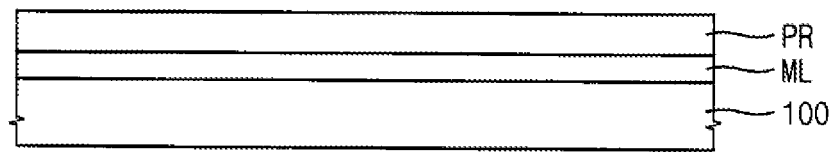
FIGS. 6A, 6B, 6C, 6D, 6E, and 6F are cross-sectional views illustrating a method of manufacturing the display substrate according to an exemplary embodiment of the present inventive concept.

Referring to FIG. 6A, a metal material is deposited on a first substrate 100 to form a metal layer ML configured to form a gate pattern and plasmonic color filter PCF.

For example, the metal material may include copper (Cu), aluminum (Al), molybdenum (Mo), titanium (Ti) or compositions thereof.

A photoresist material is applied on the metal layer ML to form a photoresist layer PR.

For example, the photoresist layer PR may include a photosensitive organic material.

Figure 6B:
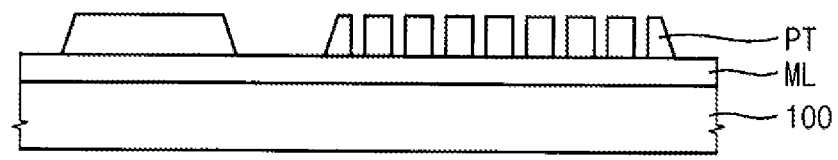

Referring to FIG. 6B, the photoresist layer PR is patterned to form a photo pattern PT.

The photoresist layer PR is patterned by a nano imprint process or a photolithography process to form the photo pattern PT.

When the photoresist layer PR is patterned by the nano imprint process, an imprint having a reverse image of a desired pattern is used.

When the photoresist layer PR is patterned by photolithography process, a first mask having a plurality of transmission portions of rectangular shape extending in a first direction and a second mask having a plurality of transmission portions of rectangular shape extending in a second direction crossing the first direction are used. The photoresist layer PR is exposed by using the first mask, and then the photoresist layer PR is exposed by using the second mask repeatedly. Thereafter, an overlapping exposed area is developed and removed. Therefore, the photoresist layer PR is patterned to form the photo pattern PT.

Referring to FIGS. 5, 6A and 6B, a first LiF layer L1 is formed on the first substrate 100 before the metal layer ML is formed on the first substrate 100 in one embodiment.

For example, a thickness of the first LiF layer L1 may be less than 1 nm.

Figure 6C:
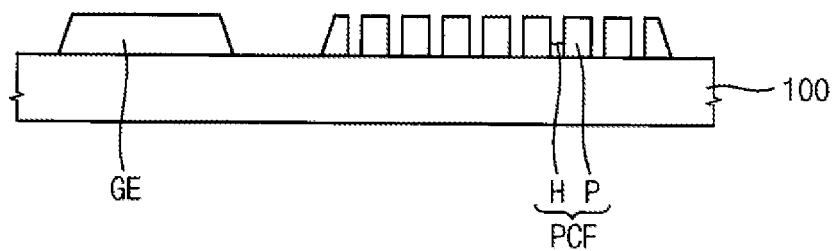

Referring to FIG. 6C, the metal layer ML is etched using the photo pattern PT as a mask to form a gate electrode GE and a plasmonic color filter PCF.

The plasmonic color filter PCF may include a plurality of holes H through which light is transmitted and a plurality of metal patterns P. A diameter of the holes H and an interval of the holes H may be adjustable. Thus, lights transmitting through adjacent plasmonic color filters PCF may have a different wavelength.

For example, the holes H may have a circular shape, a rectangular shape, a triangular shape or the like.

Referring to FIGS. 5 and 6C, after the plasmonic color filter PCF is formed, a second LiF layer L2 is formed on the plasmonic color filter PCF.

For example, a thickness of the second LiF layer L2 may be less than 1 nm.

Figure 6D:
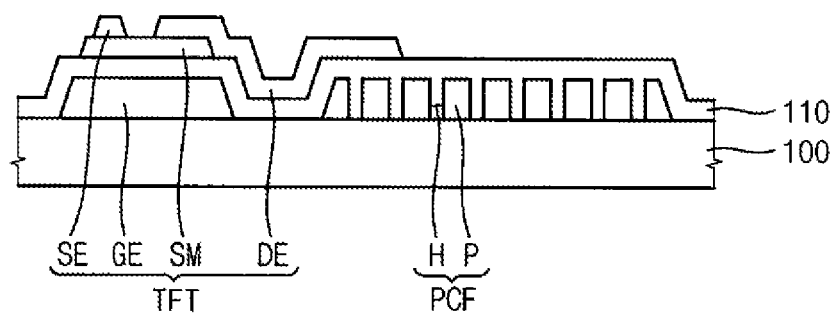

Referring to FIG. 6D, a gate insulating layer 110 covering the gate electrode GE and the plasmonic color filter PCF is formed.

The gate insulating layer 110 may cover the gate pattern, which is formed on the first base substrate 100, and may insulate the gate pattern. The gate insulating layer 110 may include an inorganic insulating material. For example, the gate insulating layer 110 may include silicon oxide ($SiO_x$) or silicon nitride ($SiN_x$).

A semiconductor pattern SM may be disposed on the gate insulating layer 110. The semiconductor pattern SM may overlap with the gate electrode GE.

A data pattern including a data line DL, a source electrode SE and a drain electrode DE is formed on the gate insulating layer 110. The data pattern may be disposed on the semiconductor pattern SM, which is formed on the gate insulating layer 110. The source electrode SE may overlap the semiconductor pattern SM. The source electrode SE may be electrically connected to the data line DL. The drain electrode DE may be spaced apart from the source electrode SE with respect to the semiconductor pattern SM. The semiconductor pattern SM may have a conductive channel between the source electrode SE and the drain electrode DE.

The source electrode SE and the drain electrode DE are disposed on the semiconductor pattern SM and the plasmonic color filter PCF and are overlapped with the semiconductor pattern SM and the plasmonic color filter PCF.

The thin film transistor TFT may include the gate electrode GE, the source electrode SE, the drain electrode DE and the semiconductor pattern SM.

Figure 6E:
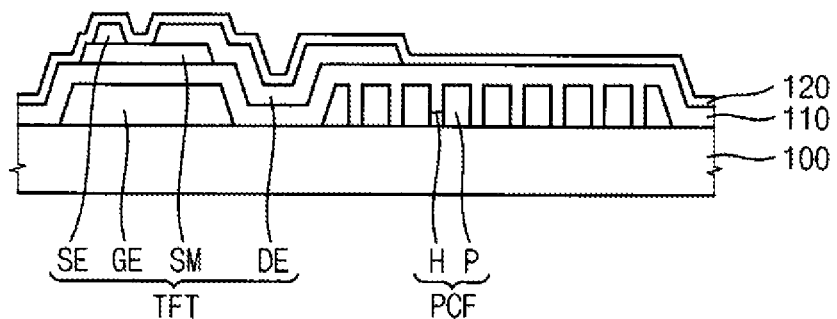

Referring to FIG. 6E, a passivation layer 120 is formed on the thin film transistor TFT and the gate insulating layer 110. The passivation layer 120 covers the source electrode SE and the drain electrode DE.

The passivation layer 120 may include an inorganic insulating material. For example, the passivation layer 120 may include silicon oxide ($SiO_x$) or silicon nitride ($SiN_x$).

Figure 6F:
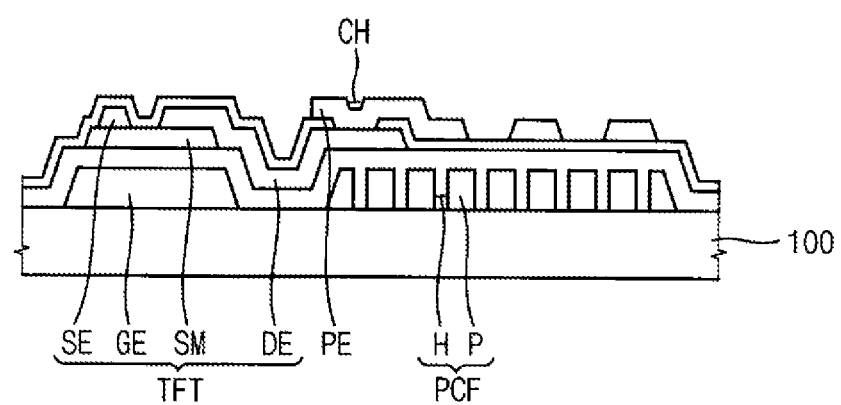

Referring to FIG. 6F, a pixel electrode PE is formed on the passivation layer 120.

For example, the pixel electrode PE may have a slit pattern.

The pixel electrode PE is electrically connected to the drain electrode DE of the thin film transistor TFT through a contact hole CH. A gray scale voltage is applied to the pixel electrode PE through the drain electrode DE of the thin film transistor TFT.

The pixel electrode PE overlaps with the plasmonic color filter PCF. Thus, a fringe field may be formed by the pixel electrode PE to which gray scale voltage is applied and the plasmonic color filter PCF to which a common voltage is applied. Therefore, a display panel according to the present inventive concept may be operated as a PLS mode.

Referring to FIGS. 3, 6A to 6F, a black matrix BM may be disposed on the second base substrate 200. The black matrix BM may block a light.

The second base substrate 200 may be a transparent insulating substrate. Examples of the transparent insulating substrate may be, but are not limited to, a glass substrate, a plastic substrate or the like.

The black matrix BM may be disposed on a non-display area of the display panel to block a light from the outside.

The black matrix BM may overlap with the gate line GL, the data line DL and the thin film transistor TFT.

The black matrix BM may include a metal material having a low transmissivity or a black material including a photosensitive organic material.

For example, the metal material may include molybdenum, titanium, tungsten or compositions thereof.

For example, the black material may include a pigment such as a carbon black or the like.

The second substrate 200 is disposed facing the first substrate 100.

Liquid crystal molecules are injected to a space between the first substrate 100 and the second substrate 200 to form a liquid crystal layer 300.

For example, the liquid crystal layer 300 may include liquid crystal molecules, sometimes called a liquid crystal. An alignment of the liquid crystal molecules in the liquid crystal layer 300 may be controlled by an electric field applied between the pixel electrode PE and the plasmonic color filter PCF which functions as the common electrode. Therefore, a light transmittance of the pixel may be controlled.

Although did not shown, the display panel further include an alignment layer orienting the liquid crystal molecules of the liquid crystal layer 300.

The liquid crystal molecules of the liquid crystal layer 300 may be pre-tilted by the alignment layer.

The foregoing is illustrative of the inventive concept and is not to be construed as limiting thereof. Although a few exemplary embodiments have been described, those skilled in the art will readily appreciate that many modifications are possible in the exemplary embodiments without materially departing from the novel teachings of the inventive concept. Accordingly, all such modifications are intended to be included within the scope of the inventive concept as defined in the claims. In the claims, any means-plus-function clauses are intended to cover the structures described herein as performing the recited function and not only structural equivalents but also equivalent structures. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The present inventive concept is defined by the following claims, with equivalents of the claims to be included therein.

What is claimed is:

1. A display panel comprising:
    a first substrate comprising a plurality of pixel areas;
    a second substrate facing the first substrate;
    a liquid crystal layer interposed between the first substrate and the second substrate;
    a thin film transistor comprising a gate electrode disposed on the first substrate, a semiconductor pattern overlapping with the gate electrode, a source electrode and a drain electrode overlapping with the semiconductor pattern and spaced apart from each other;
    a plasmonic color filter to which a common voltage is configured to be applied, and comprising a same material as the gate electrode, disposed directly on a same surface as the gate electrode, and comprising a plurality of holes through which light is configured to be transmitted; and
    a pixel electrode to which a gray scale voltage is configured to be applied, and overlapping with the plasmonic color filter, and electrically connected to the drain electrode.

2. The display panel of claim 1, wherein the gate electrode and the plasmonic color filter comprise at least one of a material selected from the group consisting of copper (Cu), aluminum (Al), molybdenum (Mo), titanium (Ti) and compositions thereof.

3. The display panel of claim 1, further comprising:
    a plurality of gate lines disposed on the first substrate and extending in a first direction; and
    a plurality of data lines disposed on the first substrate and extending in a second direction crossing the first direction,
    wherein the pixel areas are defined by the gate lines and the data lines, and plasmonic color filters including the plasmonic color filter are disposed on the pixel areas.

4. The display panel of claim 3, wherein lights configured to be transmitted through adjacent plasmonic color filters have a different wavelength.

5. The display panel of claim 4, wherein the plasmonic color filters comprise a red plasmonic color filter, a green plasmonic color filter and a blue plasmonic color filter.

6. The display panel of claim 5, wherein the holes of the red plasmonic color filter have a diameter of more than 220 nm and less than 230 nm, and the holes are spaced apart from each other by more than 500 nm and less than 600 nm.

7. The display panel of claim 5, wherein the holes of the green plasmonic color filter have a diameter of more than 175 nm and less than 185 nm, and the holes are spaced apart from each other by more than 400 nm and less than 500 nm.

8. The display panel of claim 5, wherein the holes of the blue plasmonic color filter have a diameter of more than 150 nm and less than 160 nm, and the holes are spaced apart from each other by more than 250 nm and less than 350 nm.

9. The display panel of claim 1, further comprising:
a first lithium fluoride (LiF) layer disposed on a lower surface of the plasmonic color filter; and
a second LiF layer disposed on an upper surface of the plasmonic color filter.

10. The display panel of claim 9, wherein a thickness of the first LiF layer and the second LiF layer is less than 1 nm.

11. The display panel of claim 1, wherein the pixel electrode has a slit pattern.

12. The display panel of claim 11, further comprising:
a gate insulation layer insulating the gate electrode and the plasmonic color filter; and
a passivation layer covering the source electrode and the drain electrode, and
wherein the pixel electrode is disposed on the passivation layer.

13. The display panel of claim 1, further comprising:
a black matrix disposed on the second substrate, and overlapping with the thin film transistor.

14. A method of manufacturing a display substrate, the method comprising:
forming a metal layer on a first substrate;
forming a photoresist layer on the metal layer;
developing the photoresist layer to form a photo pattern;
etching the metal layer by using the photo pattern as a mask to form a gate electrode and a plasmonic color filter comprising a plurality of holes through which light is configured to be transmitted;
forming a source electrode and a drain electrode on the gate electrode and the plasmonic color filter; and
forming a pixel electrode electrically connected to the drain electrode, and overlapping with the plasmonic color filter.

15. The method of claim 14, wherein the gate electrode and the plasmonic color filter comprise at least one of a material selected from the group consisting of copper (Cu), aluminum (Al), molybdenum (Mo), titanium (Ti) and compositions thereof.

16. The method of claim 14, wherein a plurality of gate lines are disposed on the first substrate and extend in a first direction, and a plurality of data lines are disposed on the first substrate and extend in a second direction crossing the first direction,
wherein the pixel areas are defined by the gate lines and the data lines, and plasmonic color filters including the plasmonic color filter are disposed on the pixel areas.

17. The method of claim 14, further comprising:
forming a first lithium fluoride (LiF) layer on the first substrate before forming the metal layer; and
forming a second LiF layer on an upper surface of the plasmonic color filter.

18. The method of claim 17, wherein a thickness of the first LiF layer and the second LiF layer is less than 1 nm.

19. The method of claim 14, further comprising:
forming a gate insulation layer covering the gate electrode and the plasmonic color filter; and
forming a passivation layer covering the source electrode and the drain electrode, and
wherein the pixel electrode is disposed on the passivation layer.

20. The method of claim 14, further comprising:
forming a black matrix overlapping with a thin film transistor on a second substrate;
providing the second substrate to face the first substrate; and
injecting liquid crystal molecules to a space between the first substrate and the second substrate to form a liquid crystal layer.

* * * * *